(12) United States Patent
Uzoh et al.

(10) Patent No.: US 7,195,696 B2
(45) Date of Patent: Mar. 27, 2007

(54) ELECTRODE ASSEMBLY FOR ELECTROCHEMICAL PROCESSING OF WORKPIECE

(75) Inventors: Cyprian E. Uzoh, San Jose, CA (US); Bulent M. Basol, Manhattan Beach, CA (US)

(73) Assignee: Novellus Systems, Inc., San Jose, CA (US)

( * ) Notice: Subject to any disclaimer, the term of this patent is extended or adjusted under 35 U.S.C. 154(b) by 517 days.

(21) Appl. No.: 10/723,045

(22) Filed: Nov. 26, 2003

(65) Prior Publication Data

US 2005/0006244 A1    Jan. 13, 2005

Related U.S. Application Data

(63) Continuation-in-part of application No. 09/845,262, filed on May 1, 2001, now Pat. No. 6,695,962, and a continuation-in-part of application No. 09/760,757, filed on Jan. 17, 2001, now Pat. No. 6,610,190, which is a continuation-in-part of application No. 09/568,584, filed on May 11, 2000, now Pat. No. 6,478,936.

(60) Provisional application No. 60/429,083, filed on Nov. 26, 2002.

(51) Int. Cl.
*C25D 17/00* (2006.01)
*B05C 11/00* (2006.01)

(52) U.S. Cl. ............ 204/264; 204/266; 204/276; 204/292

(58) Field of Classification Search ............ 205/98
See application file for complete search history.

(56) References Cited

U.S. PATENT DOCUMENTS 3,328,273 A    6/1967    Creutz et al.
4,258,316 A    3/1981    Leif (Continued)

FOREIGN PATENT DOCUMENTS

WO    WO 98/27585    6/1998

(Continued)

OTHER PUBLICATIONS

James J. Kelly et al., "Leveling and Microstructural Effects of Additives for Copper Electrodeposition", Journal of the Electrochemical Society, 146 (7), 1999, pp. 2540-2545, In U.S. Appl. No. 09/845,262.

(Continued)

*Primary Examiner*—Roy King
*Assistant Examiner*—Nicholas A. Smith

(74) *Attorney, Agent, or Firm*—Knobbe Martens Olson & Bear LLP

(57) ABSTRACT

The present invention provides a novel system, apparatus, and method to deposit conductive films on a workpiece. A system for electroplating a surface of a workpiece using a process solution is disclosed. The system comprises a solution housing configured to house an electrode and to contain the process solution, a filter element disposed in the solution housing configured to partition the solution housing into a lower chamber and an upper chamber, and an upper inlet port coupled to the solution housing configured to deliver the process solution to the upper chamber of the solution housing to fill the upper chamber and the lower chamber immersing the electrode in the lower chamber.

10 Claims, 8 Drawing Sheets

U.S. PATENT DOCUMENTS

| | | |
|---|---|---|
| 4,430,173 A | 2/1984 | Boudot et al. |
| 4,948,474 A | 8/1990 | Miljkovic |
| 4,954,142 A | 9/1990 | Carr et al. |
| 4,975,159 A | 12/1990 | Dahms |
| 5,084,071 A | 1/1992 | Nenadic et al. |
| 5,256,565 A | 10/1993 | Bernhardt et al. |
| 5,354,490 A | 10/1994 | Yu et al. |
| 5,516,412 A | 5/1996 | Andricacos et al. |
| 5,681,215 A | 10/1997 | Sherwood et al. |
| 5,683,564 A | 11/1997 | Reynolds |
| 5,755,859 A | 5/1998 | Brusic et al. |
| 5,762,544 A | 6/1998 | Zuniga et al. |
| 5,770,095 A | 6/1998 | Sasaki et al. |
| 5,773,364 A | 6/1998 | Farkas et al. |
| 5,793,272 A | 8/1998 | Burghartz et al. |
| 5,795,215 A | 8/1998 | Guthrie et al. |
| 5,807,165 A | 9/1998 | Uzoh et al. |
| 5,840,629 A | 11/1998 | Carpio |
| 5,858,813 A | 1/1999 | Scherber et al. |
| 5,884,990 A | 3/1999 | Burghartz et al. |
| 5,897,375 A | 4/1999 | Watts et al. |
| 5,911,619 A | 6/1999 | Uzoh et al. |
| 5,922,091 A | 7/1999 | Tsai et al. |
| 5,930,669 A | 7/1999 | Uzoh |
| 5,933,753 A | 8/1999 | Simon et al. |
| 5,954,997 A | 9/1999 | Kaufman et al. |
| 5,976,331 A | 11/1999 | Chang et al. |
| 5,985,123 A | 11/1999 | Koon |
| 6,001,235 A | 12/1999 | Arken et al. |
| 6,004,880 A | 12/1999 | Liu et al. |
| 6,017,437 A | 1/2000 | Ting et al. |
| 6,027,631 A | 2/2000 | Broadbent |
| 6,063,506 A | 5/2000 | Andricacos et al. |
| 6,066,030 A | 5/2000 | Uzoh |
| 6,071,388 A | 6/2000 | Uzoh |
| 6,074,544 A | 6/2000 | Reid et al. |
| 6,103,085 A | 8/2000 | Woo et al. |
| 6,106,378 A | 8/2000 | Perlov et al. |
| 6,113,759 A | 9/2000 | Uzoh |
| 6,132,587 A | 10/2000 | Jorne et al. |
| 6,136,163 A | 10/2000 | Cheung et al. |
| 6,156,167 A | 12/2000 | Patton et al. |
| 6,159,354 A | 12/2000 | Contolini et al. |
| 6,162,344 A | 12/2000 | Reid et al. |
| 6,176,992 B1 | 1/2001 | Talieh |
| 6,193,859 B1 | 2/2001 | Contolini et al. |
| 6,244,942 B1 | 6/2001 | Zuniga |
| 6,261,426 B1 | 7/2001 | Uzoh et al. |
| 6,261,433 B1 | 7/2001 | Landau |
| 6,297,155 B1 | 10/2001 | Simpson et al. |
| 6,299,741 B1 | 10/2001 | Sun et al. |
| 6,365,017 B1 | 4/2002 | Hongo et al. |
| 6,527,920 B1 * | 3/2003 | Mayer et al. ............... 204/237 |
| 6,695,962 B2 * | 2/2004 | Uzoh et al. ................. 205/148 |
| 2001/0017258 A1 | 8/2001 | Ishida et al. |
| 2001/0041526 A1 | 11/2001 | Perlov et al. |

FOREIGN PATENT DOCUMENTS

| | | |
|---|---|---|
| WO | WO 00/26443 | 5/2000 |

OTHER PUBLICATIONS

Joseph M. Steigerwald et al., "Chemical Mechanical Planarization of Microelectronic Materials", A Wiley-Interscience Publication, 1997, by John Wiley & Sons, Inc. pp. 212-222, In U.S. Appl. No. 09/845,262.

Robert D. Mikkola et al. "Investigation of the Roles of the Additive Components for Second Generation Copper Electroplating Chemistries Used for Advanced Interconnect Metalization", 2000 IEEE, IEEE Electron Devices Society, pp. 117-119, U.S. Appl. No. 09/845,262.

* cited by examiner

ELECTRODE ASSEMBLY FOR ELECTROCHEMICAL PROCESSING OF WORKPIECE

RELATED APPLICATIONS

This application claims priority to Provisional Application Ser. No. 60/429,083 filed Nov. 26, 2002. This application is a continuation in part of: U.S. patent application Ser. No. 09/845,262, now U.S. Pat. No. 6,695,962, filed May 1, 2001 which is a continuation in part of U.S. application Ser. No. 09/568,584 filed May 11, 2000, now U.S. Pat. No. 6,478,936; and U.S. application Ser. No. 09/760,757, now U.S. Pat. No. 6,610,190, filed Jan. 17, 2001, all incorporated herein by reference.

FIELD

This invention relates to an apparatus and a method to deposit conductive films on a workpiece, or to electropolish such conductive films off such a workpiece.

BACKGROUND

Multi-level integrated circuit manufacturing involves metal and insulator film depositions followed by photoresist patterning and material removal steps, all carried out on a workpiece surface such as a wafer surface. Photolithography and etching steps provide many features on the wafer surface such as vias, lines and bond pads. In order to form the interconnect structure, these features need to be filled with a conductive material such as copper. Next, the excess copper, also called overburden, needs to be removed by a technique such as chemical mechanical polishing or electropolishing. These techniques, after the excess material removal step, need to provide a planar wafer surface topography, making it ready again for the next level of processing, which again may involve deposition, photolithographic step and a material removal step. It is most preferred that the substrate surface be flat before the photolithographic step so that proper focusing and level-to-level registration or alignment can be achieved. Therefore, after each deposition step that yields a non-planar surface on the wafer, there is often a step of surface planarization.

Electrodeposition is a widely accepted technique used in IC manufacturing for the deposition of a highly conductive material such as copper (Cu) into the features such as vias and channels opened in an insulating layer on the semiconductor wafer surface. Electrodeposition is commonly carried out cathodically in a specially formulated electrolyte solution containing copper ions as well as additives such as accelerators, suppressors and levelers. These additives along with others such as $Cl^-$ ions control the texture, morphology and plating behavior of the copper layer. A proper electrical contact is made to the seed layer on the wafer surface, typically along the circumference of the round wafer. A consumable Cu or inert anode plate is placed in the electrolyte solution. Deposition of Cu on the wafer surface can then be initiated when a cathodic potential is applied to the wafer surface with respect to an anode, i.e., when a negative voltage is applied to the wafer surface with respect to an anode plate.

Standard plating techniques provide bottom-up material growth in submicron size features and to some extent in features with widths up to about 2–3 microns. For larger features standard electroplating yields conformal deposits. Therefore, the resulting copper layer surface display the same topography as the wafer surface at locations where the feature widths are larger than a few microns. Standard plating approaches also deposit large overburden copper that later needs to be removed by techniques such as CMP.

The importance of overcoming the various deficiencies of the conventional electrodeposition techniques is evidenced by technological developments directed to the deposition of planar copper layers. For example, U.S. Pat. No. 6,176,992, entitled Method and Apparatus for Electrochemical Mechanical Deposition, commonly owned by the assignee of the present invention, describes in one aspect an electrochemical mechanical deposition technique (ECMD) that achieves deposition of the conductive material into the cavities on the substrate surface while minimizing deposition on the field regions by polishing the field regions with a pad as the conductive material is deposited, thus yielding planar copper deposits. U.S. Pat. No. 6,482,307 entitled Method and Apparatus for Making Electrical Contact to Wafer Surface for Full-Face Electroplating or Electropolishing, filed on Dec. 14, 2000, describes in one aspect a technique for providing full-face electroplating or electropolishing. U.S. application Ser. No. 09/760,757, now U.S. Pat. No. 6,610,190, entitled Method and Apparatus for Electrodeposition of Uniform Film with Minimal Edge Exclusion on Substrate, filed on Jan. 17, 2001, describes in one aspect a technique for forming a fiat conductive layer on a semiconductor wafer surface without losing space on the surface for electrical contacts.

In such above-mentioned processes, a pad or a mask, which may also be collectively referred to as workpiece surface influencing devices, can be used during at least a portion of the electrodeposition process when there is physical contact between the workpiece surface and the pad or the mask. The physical contact or the external influence by the pad or the mask affects the growth of the metal by reducing the growth rate on the top surface while effectively increasing the growth rate within the features. This aspect is described in U.S. patent application Ser. No. 09/740,701, now U.S. Pat. No. 6.534.116, entitled Plating Method and Apparatus that creates a Differential Between Additive Disposed on a Top Surface and Cavity Surface of a Work Piece Using an External Influence, filed Dec. 18, 2000.

A general depiction of a plating apparatus in which improved anode assemblies such as those of the present invention can be used is shown in FIG. 2. The carrier head 10 holds a round semiconductor wafer 16 and, at the same time, provides rotation and lateral motion to the wafer. Electrical contacts 7 are made to the conductive lower surface of the wafer. The head can be rotated about a first axis 10b. The head can also be moved in the x direction represented in FIG. 2. An arrangement, which provides movement in the z direction is also provided for the head.

A pad 8 is provided on top of an anode assembly 9 across from the wafer surface. The pad 8 may have designs or structures such as those forming the subject matter of U.S. Pat. No. 6,413,388, entitled Pad Designs and Structures for a Versatile Materials Processing Apparatus. U.S. Pat. No. 6,413,403 entitled Pad Designs and Structures with Improved Fluid Distribution. Further, U.S. application with Ser. No. 09/960,236 filed on Sep. 20, 2001, entitled Mask Plate Design, discloses various WSID embodiments. Further, U.S. application with Ser. No. 10/155,828 filed on May 23, 2002, entitled Low Force Electrochemical Mechanical Deposition Method and Apparatus, discloses a WSID structure having a flexible and abrasive top layer attached on a highly compressible layer. Both applications are assigned to the assignee of the present invention.

In a metal deposition process using a soluble anode, it is necessary to minimize contamination of the deposited metal with anode sludge or anode fines. Typically, an anode bag is wrapped around the soluble anode to minimize this sort of contamination. In a conventional copper electrodeposition process, as shown in FIG. 1, an anode bag or filter 150 is wrapped around an anode 152. A suitable space separates the anode 152 from the cathode 154 in the deposition cell 156. Agitation, re-circulation or even filtration of the electrolyte solution 160 may be provided. During routine plating operations, anode sludge builds up in the anode sludge cavity 158 formed by the space between the anode 152 and the bag 150. In the case of Cu plating, excessive anode sludge build-up affects the quality of the deposited metal on the cathode 154 in an adverse manner. In particular, the uniformity of the deposited metal becomes poorer because of changes in the electric field distribution. In addition, the plating voltage increases because of anode polarization. The copper ions are unable to diffuse fast enough through the sludge layer to meet the requirements of the cathode. Moreover, the resulting loss in plating efficiency may cause hydrogen to be plated, or evolve at the cathode. For routine maintenance, the anode 152 is removed from the deposition cell 156 and cleaned or de-sludged before replacement.

Another concern in electrodeposition of electronic materials such as copper deposition for interconnects is the cost. The copper deposition electrolytes such as the sulfate based solutions marketed by companies such as SHIPLEY and ENTHONE need to contain organic additives for best results on wafers. These additives are costly and their depletion from the electrolyte bath needs to be minimized. Accelerators are especially prone to breakdown, although suppressors and levelers also get consumed. There are various mechanisms for organic additive consumption or breakdown in a plating system. The first mechanism is idle flow. In other words, additives may breakdown by just flowing or re-circulating within the system, especially if they are allowed to make physical contact with active surfaces. Active surfaces include but are not limited to metallic surfaces, and even the copper anode itself. Typically, plating systems have a solution tank that has some dosing means for the additives. The additives are dosed into the solution in the solution tank and the dosed solution with additives is pumped into filters and then to the electrodeposition module or modules for processing wafers. Solution from the processing modules is then sent back into the tank, also usually after filtering. This way the solution is continually re-circulated and filtered. During the circulation, additives may break down even if no wafer plating takes place in the process modules.

Another mechanism of additive consumption or breakdown takes place during plating when voltage is applied between the Cu electrode and the wafer surface and there is a plating current passing through the plating circuit. Taking into account the two mechanisms described above we can generally state that additive consumption is a function of the solution flow rate and the charge passed through the solution although there may be other dependences such as temperature and concentration effects.

Reduction of additive consumption is of utmost importance in the interconnect technology not only because these materials are costly, but also because their breakdown products accumulate in the solution and eventually start affecting the quality of the plated copper in a negative way, e.g. start to negatively impact gap-fill capability of the solution. To replenish the bath with fresh solution and to keep the concentration of additive breakdown products under control, a bleed-and-feed approach is commonly used. During bleed-and-feed, some used solution is bled or discarded and approximately the same amount of fresh solution is fed into the tank. The bled solution may optionally be cleaned and re-used later. In any case, using bleed-and-feed keeps accumulation of additive breakdown products under control. During bleed-and-feed, five to twenty percent of the total solution may have to be replaced on a daily basis. It should be appreciated that if the breakdown rate of additives could be minimized, not only the additive usage would be reduced but also the amount of fresh solution used for bleed-and-feed would be minimized. Either way, sizable cost savings and more stable process results can be achieved if additive consumption is minimized.

Several designs of anode assemblies have been disclosed. U.S. Pat. No. 6,261,433 describes an anode for copper plating, where copper electrolyte is pumped through copper particles, which are encased in a porous enclosure. U.S. Pat. No. 6,365,017 describes a plating apparatus comprising an ion exchange film or neutral porous diaphragm dividing the plating bath into a substrate region and anode region. Circulation means are provided to circulate the solution in both regions. U.S. Pat. No. 6,126,798 provides an anode including an anode cup, a filter and ion source material, the anode cup and filter forming an enclosure in which the ion source material is located. U.S. patent application Ser. No. 09/845,262, now U.S. Pat. No. 6,695,962, entitled, Anode Designs for Planar Metal Deposits with Enhanced Electrolyte Solution Blending and Process of Supplying Electrolyte Solution Using Such Designs, filed May 1, 2001 discloses a design that includes two filter elements defining an anode chamber containing the anode, and a blending chamber. The solution emanating from the anode chamber through a primary anode filter mixes with the solution delivered directly to the blending chamber. The mixed solution is then delivered to the substrate surface through a secondary filter.

There is still a need for improved anode assembly designs that provide low additive consumption, avoid anode polarization and at the same time provide high flow of particulate-free electrolyte to the workpiece surface.

SUMMARY OF THE INVENTION

The present invention provides a novel system, apparatus, and method to deposit conductive films on a workpiece. A system for electroplating a surface of a workpiece using a process solution is disclosed. The system comprises a solution housing configured to house an electrode and to contain the process solution, a filter element disposed in the solution housing configured to partition the solution housing into a lower chamber and an upper chamber, and an upper inlet port coupled to the solution housing configured to deliver the process solution to the upper chamber of the solution housing to fill the upper chamber and the lower chamber immersing the electrode in the lower chamber.

According to an aspect of the invention, a discharge port is coupled to the lower chamber configured to discharge process solution from the lower chamber of the solution housing.

According to another aspect of the invention, a lower inlet port is coupled to the lower chamber configured to deliver process solution to fill the lower chamber of the solution housing with the process solution.

According to another aspect of the invention, the filter element includes a first section having a first pore size and a second section having a second pore size. The filter can be configured to be graded.

According to another embodiment of the invention, another filter element is disposed between the lower chamber and the upper chamber to define an intermediate chamber. The another filter element includes a pore size that is smaller than the filter element.

According to an aspect of the invention, the upper inlet port is configured to deliver the process solution to fill the intermediate chamber.

According to yet another aspect of the invention, an intermediate inlet port is coupled to the intermediate chamber configured to deliver process solution to fill the intermediate chamber with process solution. The intermediate inlet port can be configured to deliver process solution to fill the upper chamber.

Advantages of the invention include improved anode assembly designs that provide low additive consumption, avoid anode polarization and at the same time provide high flow of particulate-free electrolyte to the workpiece surface to improve device consistency and yield.

DRAWINGS

The invention is described in detail with reference to the drawings, in which.

DETAILED DESCRIPTION

For clarity, the electrode assemblies will be referred to as "anode assemblies" and cathodic electroplating will be used as an example in the following description. It should be understood that the same electrode designs are applicable to cathode assemblies that may be used for electropolishing processes Each of the anode assemblies discussed below is particularly adapted to be used with a soluble, i.e. consumable, anode. However, it is contemplated that the anode assemblies could utilize or be utilized as inert anodes and that the assemblies could be used in electroetching or electropolishing applications as well as metal deposition applications.

Figure 1:
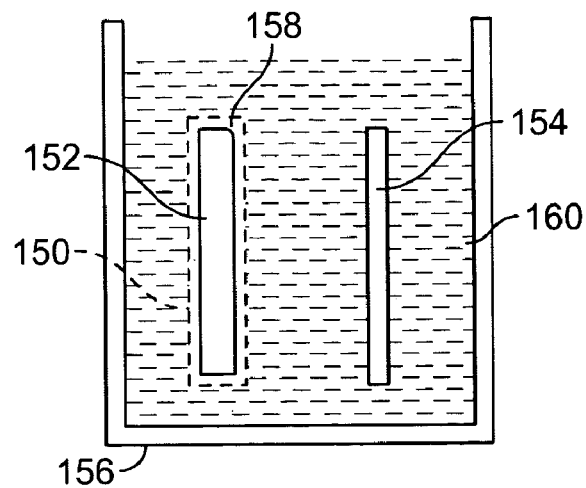
FIG. 1 shows a conventional copper electrodeposition process.
Figure 2:
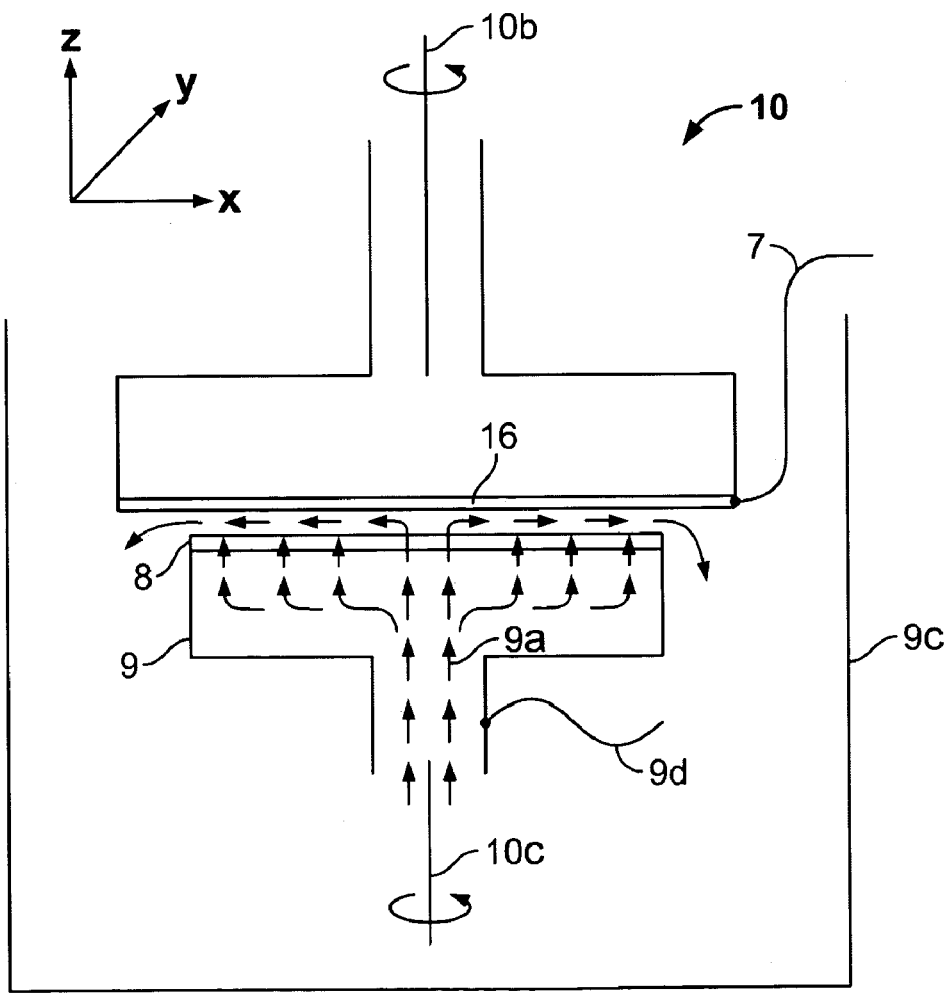
FIG. 2 shows a general depiction of a plating apparatus applicable to the present invention.
Figure 3:
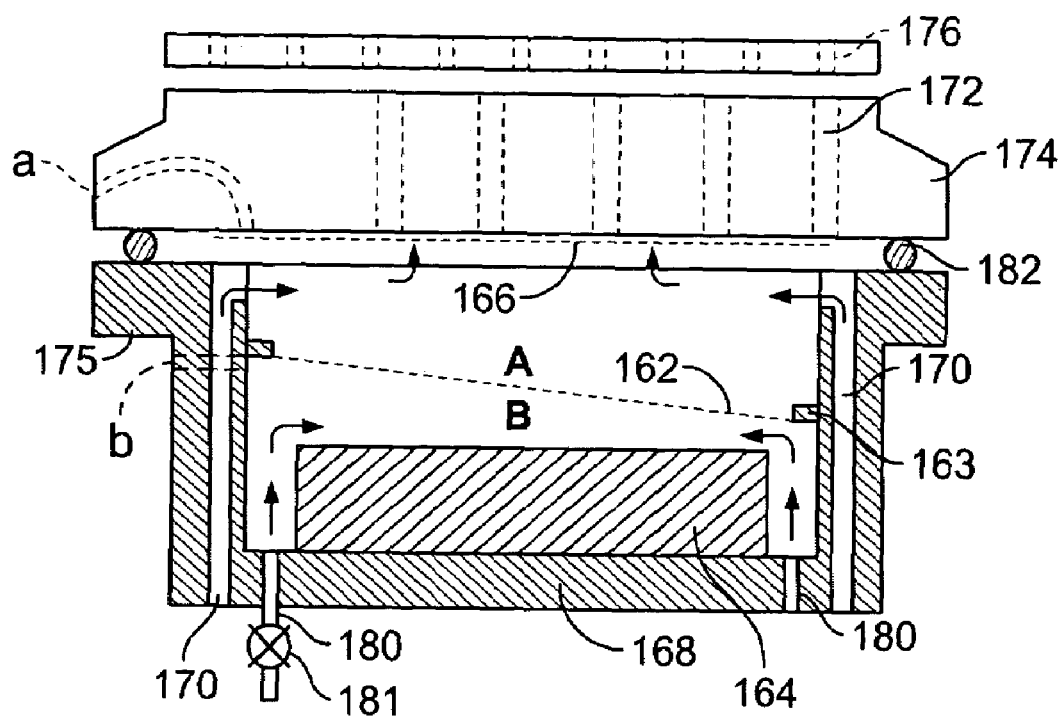
FIG. 3 shows an anode assembly with multiple filters and vertically configured primary and secondary fluid delivery channels in accordance with an embodiment of the present invention.

According to the invention, multiple anode filters, disposed at several locations within the anode housing, are used. Filters with different pore sizes are provided. Filters can also be laminated between two porous sheets. FIG. 3 shows an anode assembly with multiple filters and vertically configured primary and secondary fluid delivery channels. In this anode configuration, a primary anode filter 162 is disposed, by way of a filter mount 163, within the anode chamber and essentially isolates the anode 164 from the rest of the anode chamber. The primary anode filter 162 may, for example, consist of one or multiple layers of napped polypropylene cloth, or a polyethylene, polysulfone, hydrophilic PVDF, or PFTE filter, with a particle or pore size of less than 1.0 micron, average, in diameter. The filter 162 entombs anode sludge around the anode 164. Disposed away from the primary anode filter 162 is an upper anode filter 166. The pore size of the upper anode filter 166 is preferably between 30 microns and 0.1 micron in diameter. The upper anode filter 166 is secured in place in such a way that it is effective in filtering the electrolyte solution or fluid that communicates with the cathode.

A cavity A, within the anode housing 168, separates the primary anode filter element or elements 162 and the upper or secondary anode filter 166. The cavity or chamber A may be referred to as an inter-filter blending chamber. In this chamber A, the solution emanating from a lower anode chamber B blends or is mixed with solution from at least one primary flow channel 170. Together, the chambers A and B form an internal housing volume into which the electrolyte solution can flow. The filter 162 thus divides the internal housing volume into the lower anode chamber B and the inter-filter blending chamber A, which is located between the lower anode chamber and a top anode plate 174. In the embodiment illustrated in FIG. 3, and in each of the embodiments shown in FIGS. 4–6 which will be described, the blending of electrolyte solution in the chamber A and the higher velocity, or rate of flow, of the solution flowing from the primary flow channel enhance the migration of copper or other metal ions from the lower anode chamber B into the blending chamber A. This enhanced ion migration, in other words, is provided by the blending which occurs in the chamber A and because a flow of the electrolyte solution into the blending chamber A occurs at a higher rate than a flow of the solution into the anode chamber B. The dynamic mixing and migration reduce the copper ion concentration difference between the lower anode chamber B and the upper inter-filter blending chamber A, thus reducing cell polarization due to any large ion concentration differences in the cell.

The primary flow channel may be a vertical channel providing for electrolyte solution or fluid communication and can be incorporated into the anode housing. The primary and secondary flow channels can both be formed as apertures within the wall of the cell, as shown in FIG. 3. The primary flow channels 170 transfer the bulk of the solution, more than 60%, directly into the inter-filter blending chamber A. The solution is then filtered by the very fine upper anode filter 166, which has apertures that, typically, are less than 10.0 micron, and preferably 0.02–0.5 micron, in average diameter. The filtered solution then is transferred to the cathode via channels 172 in the anode top plate 174 and channels 176 in a pad or pad assembly 178. The top anode plate 174 forms a closure for the internal housing volume and is secured to a flange 175 defined at an upper end of the anode housing in any appropriate way such as, for example, by bolts. The solution can thus be discharged from the internal housing volume towards the surface of a semiconductor substrate through the channels 172 in the top plate 174 and through the channels 176 in the pad or pad assembly. An O-ring seal 182 may be provided between an underside of the top anode plate 174 and the flange 175 to prevent leakage of plating or plating/planarization solution. The O-ring may be omitted to allow for controlled fluid leakage between the flanges. Controlled leakage may be used to remove bubbles in the mixing chamber. The top anode plate 174 may have essentially the same construction as the pad support plate 22 of U.S. Pat. No. 6,478,936 mentioned earlier, while the pad or pad assembly 178 may have essentially the same structure as the pad 8 of the same earlier mentioned application.

Figure 6:
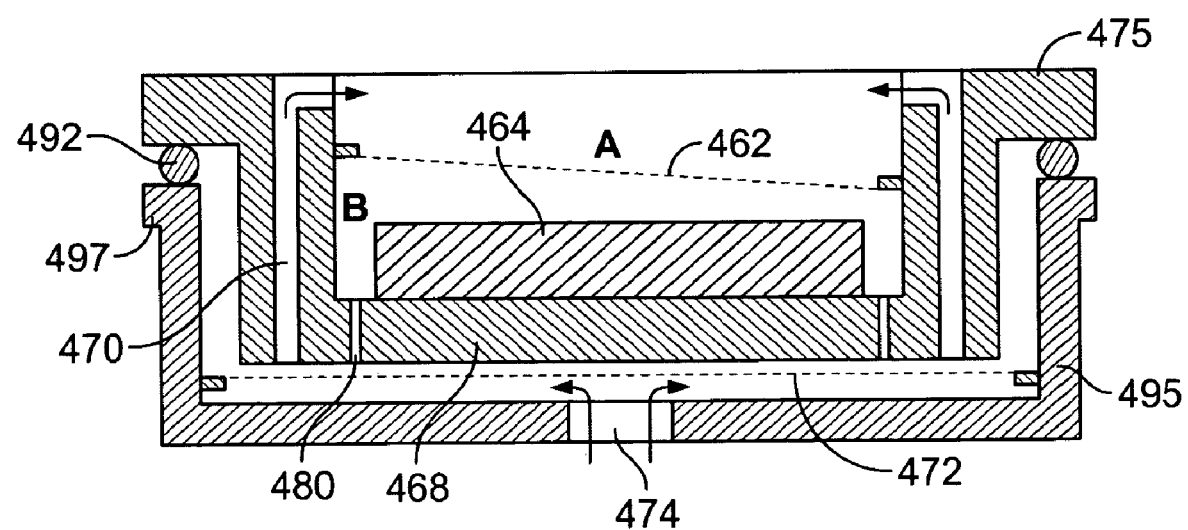
FIG. 6 shows an embodiment having an external filter disposed below an upper anode housing.

The secondary flow channels 180 convey the balance of the electrolyte into the lower anode chamber or space B surrounding the anode 164. The solution emanating from the lower anode chamber B is filtered by the primary anode filter 162 before entering and mixing with the solution in the inter-filter blending chamber A. Preferably, the electrolyte flow through the secondary flow channels 180 is controlled using valves 181. During the electrochemical process, the valves 181 are turned on to allow electrolyte flow into the lower anode chamber. However, between the processes, electrolyte solution flow through the valves 181 is turned off to prevent idle flow so that the additive consumption occurring during the idle flow is advantageously averted. In other cell configurations, another, external, filter, or a set of additional external filtering elements, may be provided. FIG. 6 shows one such cell configuration, in which an external filter 472 is disposed below an upper anode housing 468. This external or "inter-bowl" filter 472 may be used to pre-filter the electrolyte solution flowing in from a fluid inlet 474. The cell configuration of FIG. 6 also includes an anode 464 disposed in a lower anode chamber B which is separated from an inter-filter blending chamber A by a primary anode filter 462. As in the embodiment shown in FIG. 3, the primary anode filter 462 may consist of one or multiple layers of filters or a filter cartridge assembly with a particle or pore size between 1 and 5 microns in diameter. The primary anode filter 462 entombs anode sludge around the anode 464.

An upper anode filter (not shown in FIG. 6) is disposed away from the primary anode filter 462, and it is to be understood that a top anode plate (not shown in FIG. 6) is mounted to a flange 475 of upper anode bowl or housing 468, similar to the way in which the top anode plate 174 is mounted to the flange 175 in the embodiment shown in FIG. 3, thereby forming the inter-filter blending chamber A.

The upper anode bowl 468 includes primary flow channels 470 and secondary flow channels 480 having the same configurations and functions as the primary and secondary flow channels 170 and 180 shown in FIG. 3. As mentioned above, the external or inter-bowl filter 472 is disposed below the upper anode housing 468. This external filter can be mounted, e.g. by an appropriate filter mount, to a lower anode housing or bowl 495, and pre-filters the solution before it passes into the chambers A and B. The lower anode housing or bowl 495 defines a flange 497 which is connected, e.g. by bolts, to the flange 475 of the upper anode bowl or housing 468. An additional o-ring seal 492 can be disposed between facing surfaces of the flanges 475 and 497 to provide sealing. In all other aspects, the anode configuration of FIG. 6 is constructed in the same way as that shown in FIG. 3.

Figure 5:
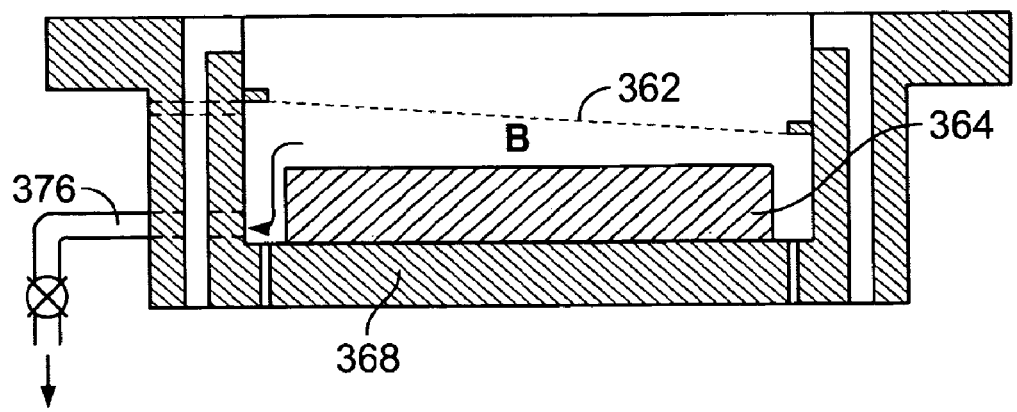
FIG. 5 shows an anode sludge drain in accordance with an embodiment of the present invention.

FIG. 5 illustrates the incorporation of an anode sludge drain 376 into another anode configuration. Anode sludge is drained, at routine intervals or as needed, through the opening provided by the anode sludge drain. Any practical device may be used to suck or evacuate the lower anode chamber B during routine wafer or workpiece processing or at any other suitable time. Thus, it is not necessary to disassemble the anode housing 368 and remove the primary anode filter 362 to de-sludge or clean the anode chamber B, as is typical in prior art operations. The in-situ anode drain 376 improves plating cell utilization, because the need for routine anode service is eliminated. The in-situ de-sludge operations also enhance the life of the lower anode filter.

In all other aspects, the anode configuration of FIG. 5 is constructed in the same way as that shown in FIG. 3.

Figure 4:
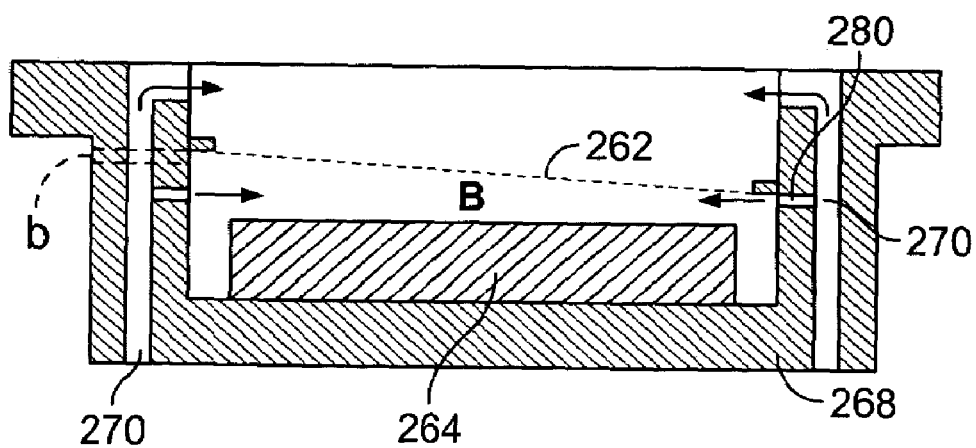
FIG. 4 shows secondary flow to a lower anode chamber tapped from primary flow channel orifices in accordance with an embodiment of the present invention.

In other arrangements, the secondary flow to the lower anode chamber B may be tapped from the primary flow channel orifices as shown in FIG. 4. Here, apertures narrower than those of the primary flow channels 270 form the secondary flow channels 280 and are used to partition or divert a portion of the fluid in the primary channels 270 into the lower anode chamber B of the housing 268 surrounding the anode 264. In all other aspects, the anode configuration of FIG. 4 is constructed in the same way as that shown in FIG. 3.

Besides the flow channels described above, an additional small orifice (b), as indicated in FIGS. 3 and 4, or multiple additional orifices (not shown) may be provided to allow the electrolyte to leak out from the lower anode chamber B to the outside of the anode housing 168, 268, 368, or 468. At least one of these orifices is preferably provided to remove any bubbles that may be trapped between the anode upper surface and the primary anode filter. Similar air bleeder holes (a), as indicated in FIG. 3, may be incorporated in the top anode plate or in the upper walls of the anode housing. When the bleeder holes are absent, a de-gassing filtering element (not shown) may be used to de-gas the solution before the solution is transferred to the plating cell. For effective bubble removal, it is imperative that the filters 162, 262, 166, 462 and 362 be slanted or disposed at angles in the range of 1 to 30 degrees with respect to the horizon with the bleed hole disposed at the highest regions just below the filter.

In other operations, the lower anode chamber B may also be activated as needed to remove any large bubbles that may be trapped below the primary anode filter 162, 262, 362, or 462. The solution can be drained, filtered, and returned to the solution reservoir.

A similar draining arrangement may be incorporated in upper regions of the anode housing 168, 268, 368, or 468. This will be used to remove any large trapped air bubbles in chamber A, just beneath the upper anode filter.

As described above, the anode housing is divided into an anode chamber or a lower chamber including the anode and an upper chamber or a blending chamber. A filter element separates the blending chamber from the anode chamber which is disposed beneath the blending chamber. The process solution from the anode chamber flows through the filter and blends with the process solution that is supplied into the upper chamber.

In the following embodiments, a reverse flow system is used so that the process solution is preferably delivered substantially to the upper chamber, and through the filter element, the solution is introduced from the upper chamber into the lower chamber. The reverse flow of the process solution keeps the filter element clean, avoiding clogging, and at the same time introduces enough solution to the lower chamber to prevent anode polarization. In one aspect of the present invention, restricted flow into the lower chamber also minimizes additive consumption.

In another embodiment, the filter element may have very small pore size. During the process, due to the relatively small pore size of the filter element, only a small percentage of the solution flows down to the lower chamber, the balance of the solution is kept in the upper chamber. This construction allows less process solution to flow into the lower anode chamber and as a consequence minimizes consumption of additives by the anode. Accordingly, in both reverse flow embodiments, by appropriately increasing the height of the upper chamber with respect to the height of the lower chamber, adequate reverse process solution flow from the upper chamber to the lower anode chamber is provided to keep the filter element clean and also avoid the problem of anode polarization. The above systems may be constructed using more than one filter element and this approach is also within the scope of the present invention.

Figure 7A:
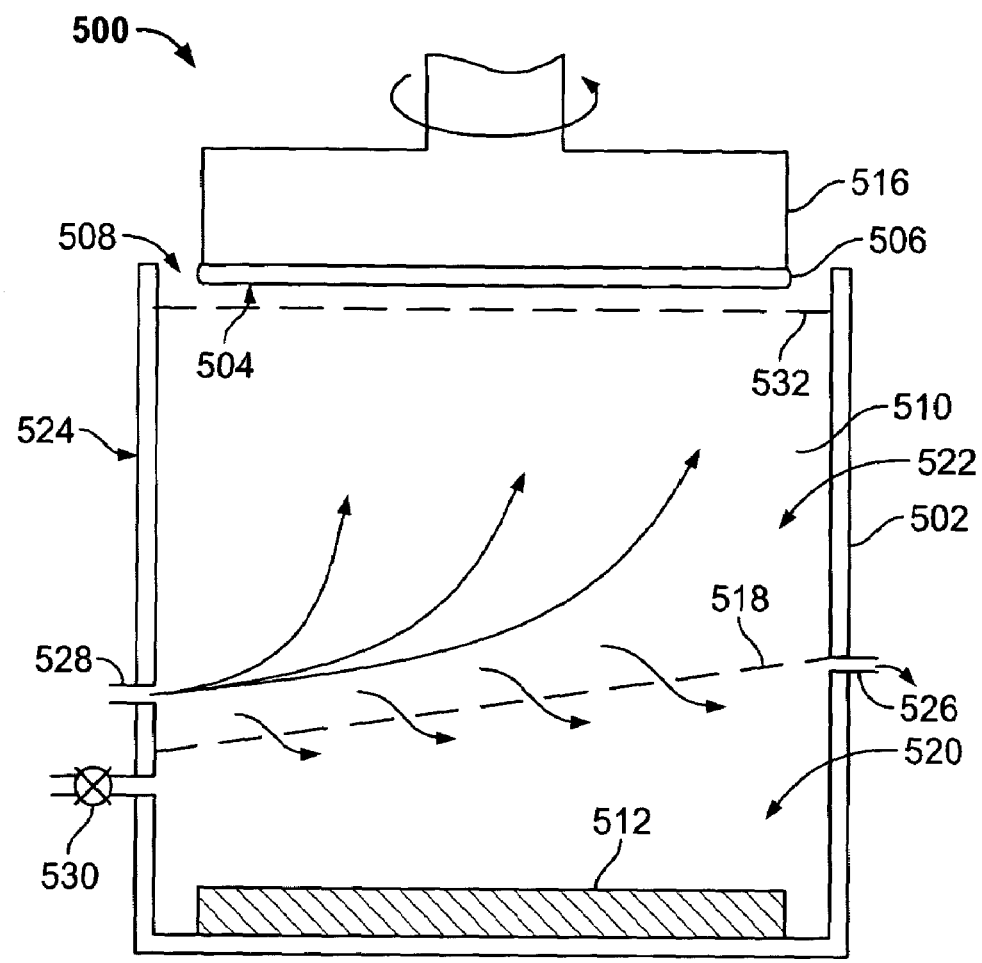
FIG. 7A shows an electrochemical processing system using reverse solution flow in an anode housing in accordance with an embodiment of the present invention.

FIG. 7A shows an electrochemical processing system 500 using the reverse solution flow of the present invention in anode housing 502. Surface 504 of a workpiece 506 is placed on a top opening 508 of the anode housing during an electrochemical process. In the following embodiments the workpiece is a semiconductor wafer, preferably a silicon wafer. The surface of the wafer includes a thin conductive layer, preferably a copper seed layer formed on a typical barrier layer. A process solution 510 fills the anode housing 502 up to the opening 508 and contacts both the surface of the wafer and an anode 512 which is placed on the bottom of the anode housing. The process solution can be a plating solution. The anode 512 is kept submerged in the plating solution that fills the anode housing. The wafer is held and moved by a workpiece carrier head 516.

Figure 8A:
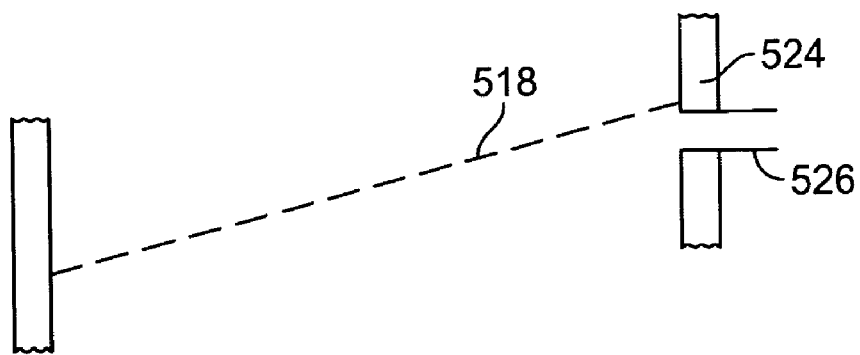
FIGS. 8A–8C shows alternative embodiments of filter designs in accordance with the present invention.
Figure 8B:
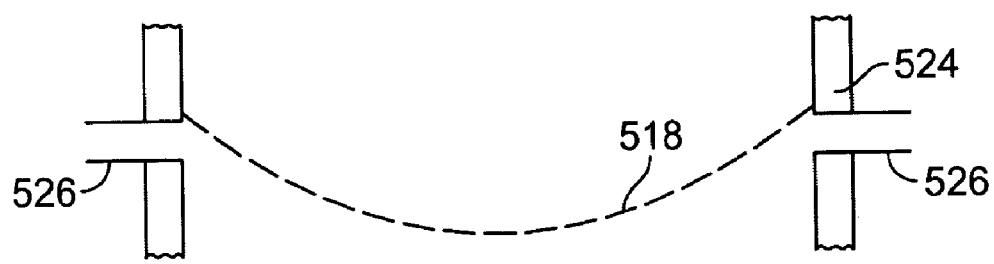
Figure 8C:
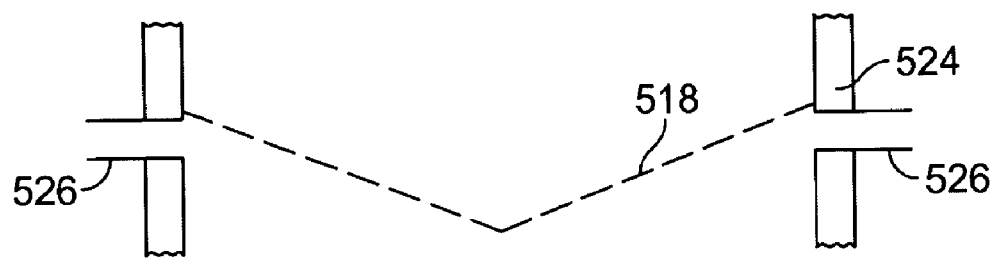

A filter element 518 divides the housing 502 into an anode chamber 520 (or lower chamber) and a supply chamber 522 (or upper chamber). The pore size of the filter may be approximately in the range of 0.02 to 1.0 microns. It should be noted that unlike prior art approaches reverse flow design of the present invention may use filters with larger pore size because the sub-micron size particles generated in the lower chamber are always pushed down by the reverse flow and they do not get the chance to go through the filter 518 into the upper chamber. In this embodiment, the filter 518 is attached to sidewall 524 of the anode housing in a slanted manner. In the anode chamber, a bleeding port 526 is placed adjacent an upper end of the filter 518 for establishing a solution flow in the lower chamber, and also for removing any gas bubbles from the lower chamber. As shown in FIGS. 8A–8C, the filter 518 may have a slanted, concave or V-shape designs. In each design, however, one or more bleeding ports 526 is placed adjacent upper end of the filter 518 to remove bubbles. The plating solution that leaves the anode housing along with the bubbles and particulates generated in the lower chamber is collected by a plating solution recycling circuit (not shown) and filtered and recycled to be used again.

Referring back to FIG. 7A, the plating solution 510 is supplied to the supply chamber 522 through a supply port 528 on the sidewall 524 of the anode housing. There may be one or several supply ports. Most of the solution supplied into the upper chamber moves up towards the workpiece surface. This is indicated with the large arrows in FIG. 7A. Some solution, however goes to the lower chamber. Flow of plating solution to the anode chamber takes place through the filter 518, as shown with small arrows. The solution flows to anode chamber and leaves the anode chamber through the bleeding port 526. Such reverse flow of the process solution avoids clogging up of the filter with particulates since it continually cleans the filter. Solution coming from the upper chamber, impurities from the anode sludge and any bubbles that may be present leave the anode chamber through the bleeding port 526. At the beginning of the plating process, the anode chamber may have to be pre-filled with the solution rapidly. For this, an auxiliary inlet valve may be used. The auxiliary inlet valve 530 may be positioned in the sidewall 524 and next to a lower edge of the filter. Once the anode chamber is full, the auxiliary inlet valve is closed and process commences. It should be noted that auxiliary inlet to the anode chamber is optional.

Figure 7B:
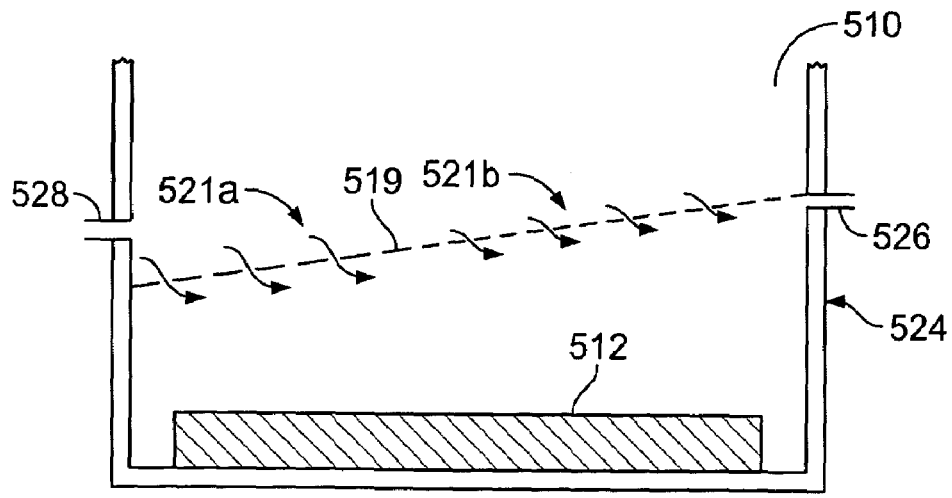
FIG. 7B shows an alternative embodiment of a lower portion of an electrochemical processing system in accordance with the present invention.

FIG. 7B shows a redesigned lower portion of the system 500. In this embodiment, the auxiliary inlet is removed from the system, and a composite filter element 519 replaces the filter element 518. The composite filter element may comprise filters with more than one pore size. As exemplified in FIG. 7B, a first section 521a may have a larger pore size than a second section 521b. As a result, solution flow per unit area through the first section 521a down to the anode chamber is larger than solution flow per unit area through the second section 521b. This way, the anode chamber may be filled fast at the beginning of the process and a well-regulated solution flow is established in the anode chamber that flows over the anode from left to right and exits the anode chamber through the bleed holes.

It should be noted that the amount of solution flowing from the supply chamber 522 to the anode chamber 520 depends on various factors such as the pore size of the filter element, size of the bleed holes and the hydraulic pressure of the solution in the supply chamber 522 over the filter element. Generally, as the height of the upper chamber increases, the pressure generated by the solution on the filter increases increasing the flow going into the lower chamber. Similarly, as the pore size of the filter element increases, the pressure drop across the filter element decreases and the solution flow from the supply chamber 522 to the anode chamber 520 increases, on condition that the bleed hole size does not restrict this flow. It is understood however that such variables can be easily changed in the design of the processing chamber to obtain best results.

An upper filter 532 may optionally be placed adjacent the opening 508 of the housing to regulate flow and to filter the solution one more time, as the solution is flowed through the supply chamber against the surface of the wafer. This filter may be coarser than the filter 518, i.e., it may have larger pore size. Solution that is flowing out the opening 508 is collected by the recycling circuitry (not shown) to replenish and feed back the solution to the anode housing 502.

Figure 9A:
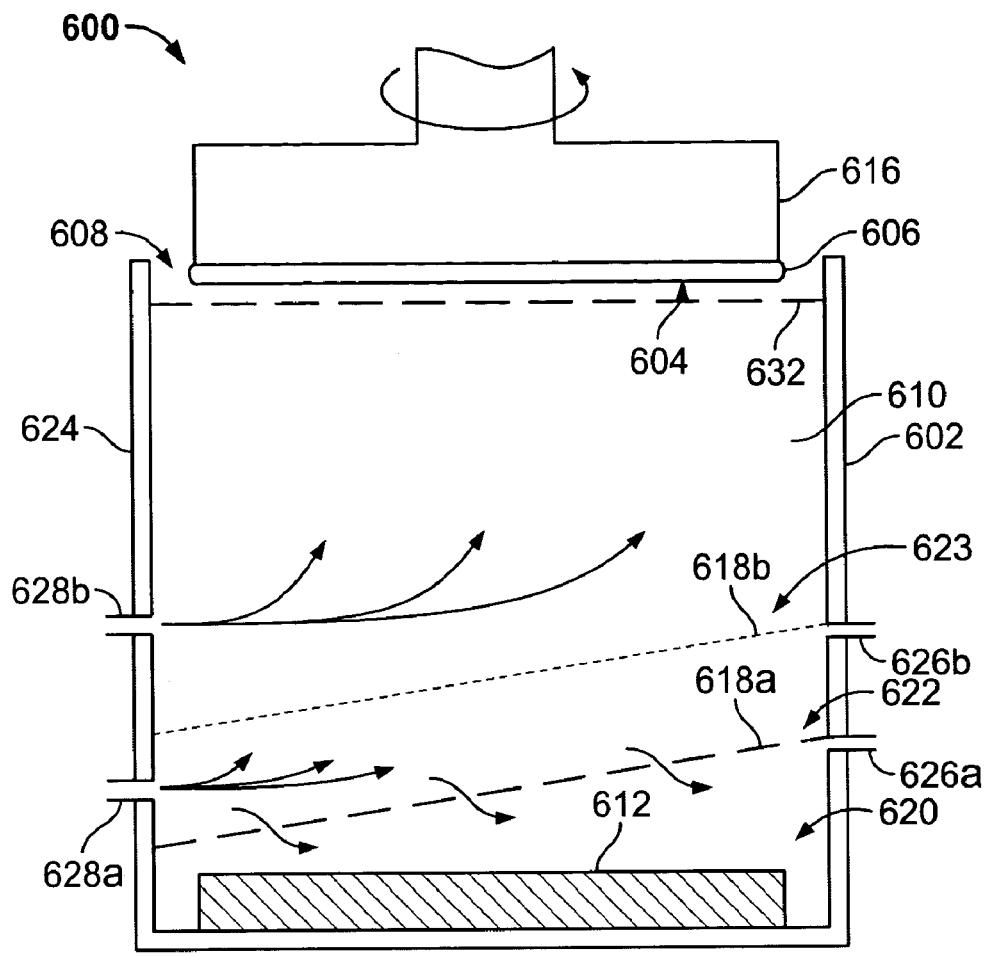
FIG. 9A shows an electrochemical processing system using reverse solution flow with multiple filters in an anode housing in accordance with an embodiment of the present invention.

FIG. 9A shows an electrochemical processing system 600 using the reverse solution flow of the present invention with multiple filters in an anode housing 602. Surface 604 of a wafer 606 is placed on a top opening 608 of the anode housing during an electrochemical process using the system 600. A plating solution 610 fills the anode housing 602 up to the opening 608 and contacts both the surface of the wafer and an anode 612 which is placed on bottom wall 614 of the anode housing. The anode 612 is kept submerged in the plating solution that fills the anode housing 602. The wafer is held and moved by a workpiece carrier head 616.

A first filter element 618a separates an anode chamber 620 (or lower chamber) from a first supply chamber 622 (or intermediate chamber). The pore size of the first filter may preferably in the range of 0.2 to 10 microns. It may even have larger pore size or it may be a composite filter such as the one shown in FIG. 7b. Further, a second filter 618b separates the first supply chamber from the second supply chamber 623 (upper chamber). The pore size of the second filter may be very small such as in the range of 0.01 to 0.1 microns, typically 0.05 microns. In this embodiment, the filters 618a and 618b are preferably attached to sidewall 624 of the anode housing in a slanted manner. The filters 618a and 618b may be placed parallel to one another or they may be slanted in different directions. In the anode chamber, at least one, preferably multiple bleeding ports 626a are-placed adjacent an upper end of the filter 618a for removing solution, gas bubbles and particles generated in the lower chamber. The plating solution that leaves the anode housing 602 is collected by a plating solution recycling circuit (not shown) and filtered and recycled to use it again.

Figure 9B:
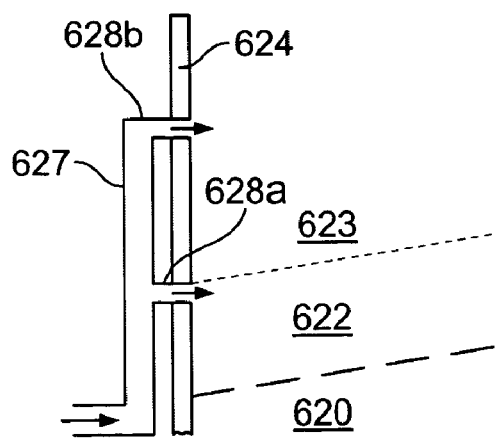
FIG. 9B shows a partial sidewall view of a first and second supply ports connected to a common supply line in accordance with an embodiment of the present invention.

The plating solution 610 is supplied to the first supply chamber 622 through a first supply port 628a and to the second supply chamber through a second supply port 628b. The first and second supply ports may be connected to separate solution supply lines, or as shown in FIG. 9B, to a common supply line 627 which delivers plating solution to both ports 628a and 628b. FIG. 9B, shows a partial view of sidewall 624, with alternative solution delivery scheme including the common supply line 627.

Delivery of plating solution to the anode chamber takes place through the filter 618a. The plating solution flows into first supply chamber 622 and then into the anode chamber 620 and leaves the anode chamber through the bleed port 626a. As mentioned above, the reverse flow of the process solution keeps the filter 618a clean and, also, prevents anode polarization. As in the previous embodiment, impurities and bubbles leave the anode chamber through the bleed port 626a. The plating solution from the second supply port fills the supply chamber 623 and reaches the surface 604 of the wafer. Due to the small pore size of the second filter, and the pressure built in the first supply chamber 622, almost no solution flow from the second supply chamber to the first supply chamber occurs. Use of the second filter 618b which has very fine pores advantageously transports an important fraction of the supplied process solution from a supply tank to the surface of the wafer while less process solution flows into the anode chamber through filter 618a. As a result, consumption of additives by the anode is minimized, and additionally, none of the particles generated by the anode can diffuse across the filter 618a. Even if some particles could diffuse through the filter 618a and into the chamber 622, the extremely fine filter 618b assures that they do not get into the top chamber where they can find their way onto the substrate. It should be noted that the bleed hole 626b is optional, but preferable, since any gas bubbles trapped in chamber 622 may be eliminated through the bleed hole 626b. In this embodiment, the supply ports 628a, 628b and bleed ports 626a, 626b may be controlled by valves for the purposes of controlling the amount of solution delivered and kept in the housing. Alternately, sizes of these orifices are selected such that the amount of solution flow through them is pre-determined. Size of the bleed holes also affects the pressure build up in chambers 620 and 622. Pressure build-up in chambers, in turn, affects the amount of solution flow down into chamber 620 from chamber 622. Solution that is flowing out the opening 608 is collected by the recycling circuitry to replenish and feed back to anode housing. Optionally, an upper filter 632 is placed adjacent the opening 608 of the housing. Solution that is flowing out the opening 608 along with the solution from the bleed ports 626a, 626b is collected by the recycling circuitry to replenish and feed back to anode housing.

Figure 10:
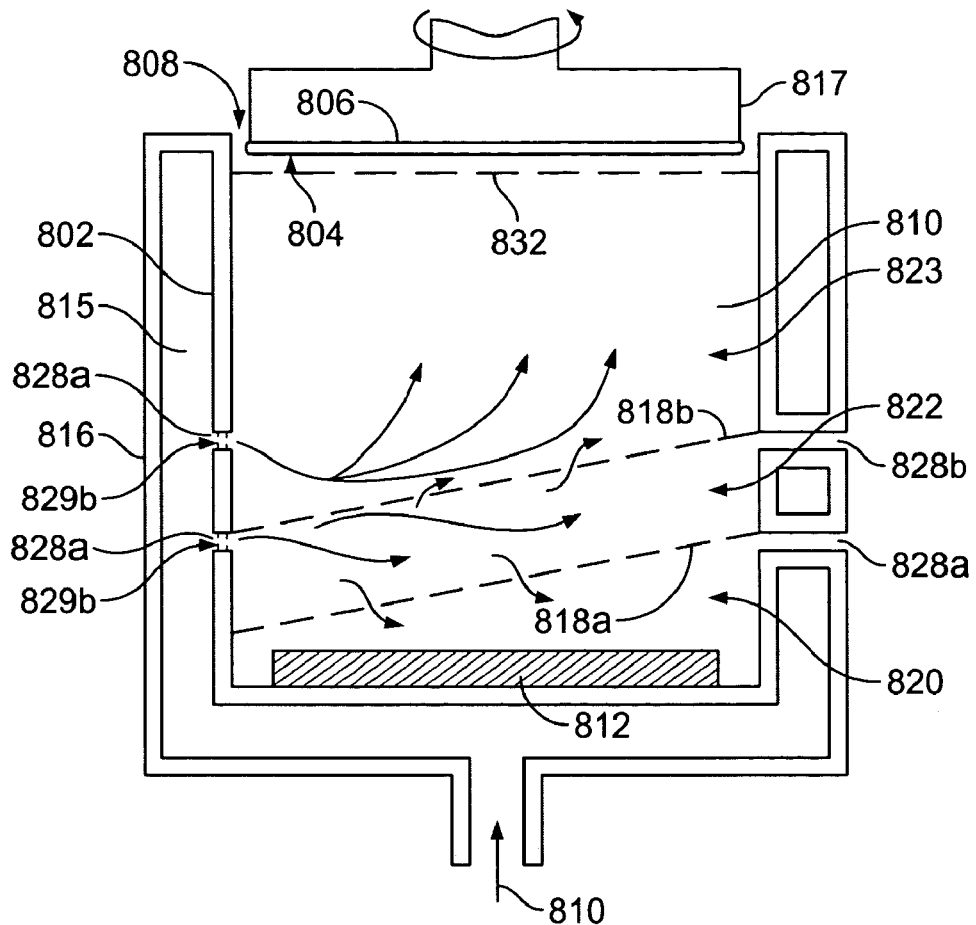
FIG. 10 shows different size filters in supply ports to regulate solution flow in accordance with an embodiment of the present invention.

FIG. 10 shows a design where different size filters in supply ports are used to regulate flow. The electrochemical processing system 800 uses the reverse solution flow of the present invention in anode housing 802. Surface 804 of a wafer 806 is placed on a top opening 808 of the anode housing during an electrochemical process. A plating solution 810 fills the anode housing 802 up to the opening 808 and contacts both the surface of the wafer and an anode 812 which is placed on bottom wall 814 of the anode housing. The solution is delivered to the anode housing through a cavity 815 of a solution container 816 encasing the anode housing 802. The anode 812 is kept submerged in the plating solution that fills the anode housing. The wafer is held and moved by a workpiece carrier head 817.

A first filter 818a separates an anode chamber 820 (or lower chamber) from a first supply chamber 822 (or intermediate chamber). The pore size of the first filter may be course. Further, a second filter 818b separates the first supply chamber from the second supply chamber 823 (upper chamber). As in the system 600 above, the pore size of the second filter may be very small. In the anode chamber, a bleeding port 828a is placed adjacent an upper end of the filter 818a for removing gas bubbles, solution and impurities. The plating solution 810 is supplied to the first supply chamber 822 through a first supply port 828a and to the second supply chamber through a second supply port 828b. The supply ports may include a first supply filter 829a and a second supply filter 829b respectively.

Selection of the total area of the supply ports and the porosity or pressure drop of filters 829a and 829b are important factors to determine solution flow. It is preferable that the solution pressure drop in filter 829a be larger than that of filter 829b. In this way, during processing when there is high plating solution flow, a larger portion of the solution flows into second supply chamber 823 and reaches the surface of the wafer. Restricted flow into the first supply chamber 822 and thus into the anode chamber advantageously reduces additive consumption. During idle flow, on the other hand the total solution flow through the supply ports 828a and 828b may be reduced. When this is done, since the pressure drop across filter element 829a is larger than that of across the filter element 829b, even a larger portion of the restricted flow is expected to go to the second supply chamber. Thus during idle flow, solution flow into the anode chamber is further reduced and additive consumption is further reduced.

As is understood from the foregoing, additive consumption in an electrochemical process chamber can be reduced by reducing or totally shutting down the solution flowing into the anode chamber where a copper electrode (or any other electrode) resides. This can be achieved automatically in some designs, such as the design shown in FIG. 10. In designs that bring the plating solution to the anode chamber through a separate supply line, a control valve on this supply line may be used to reduce or shut down the flow to the anode chamber, especially during idle flow. During the process, this flow cannot be totally shut down since such flow may cause anode polarization.

Figure 12:
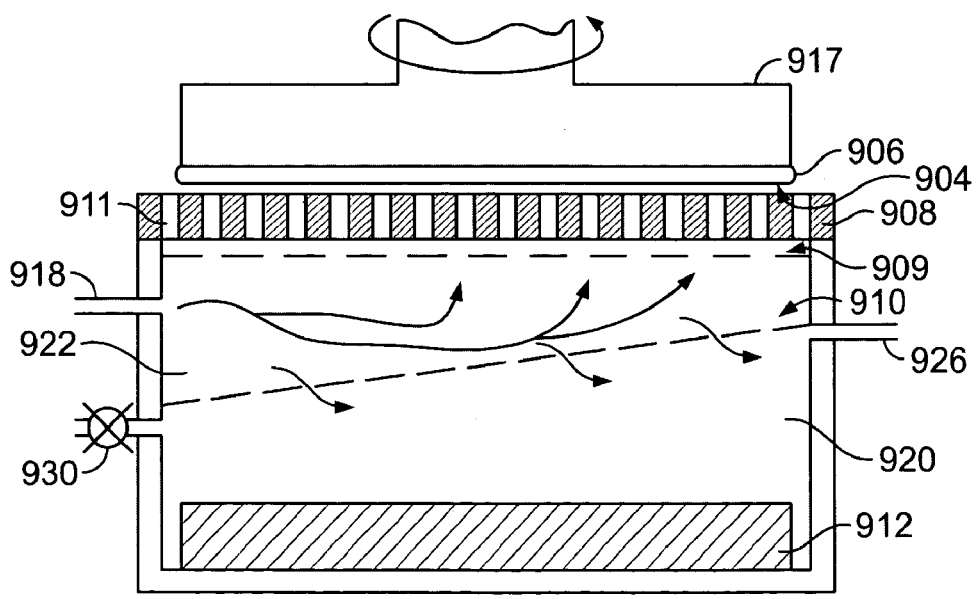
FIG. 12 shows a side view along a longer lateral dimension of the anode housing of FIG. 11.
Figure 11:
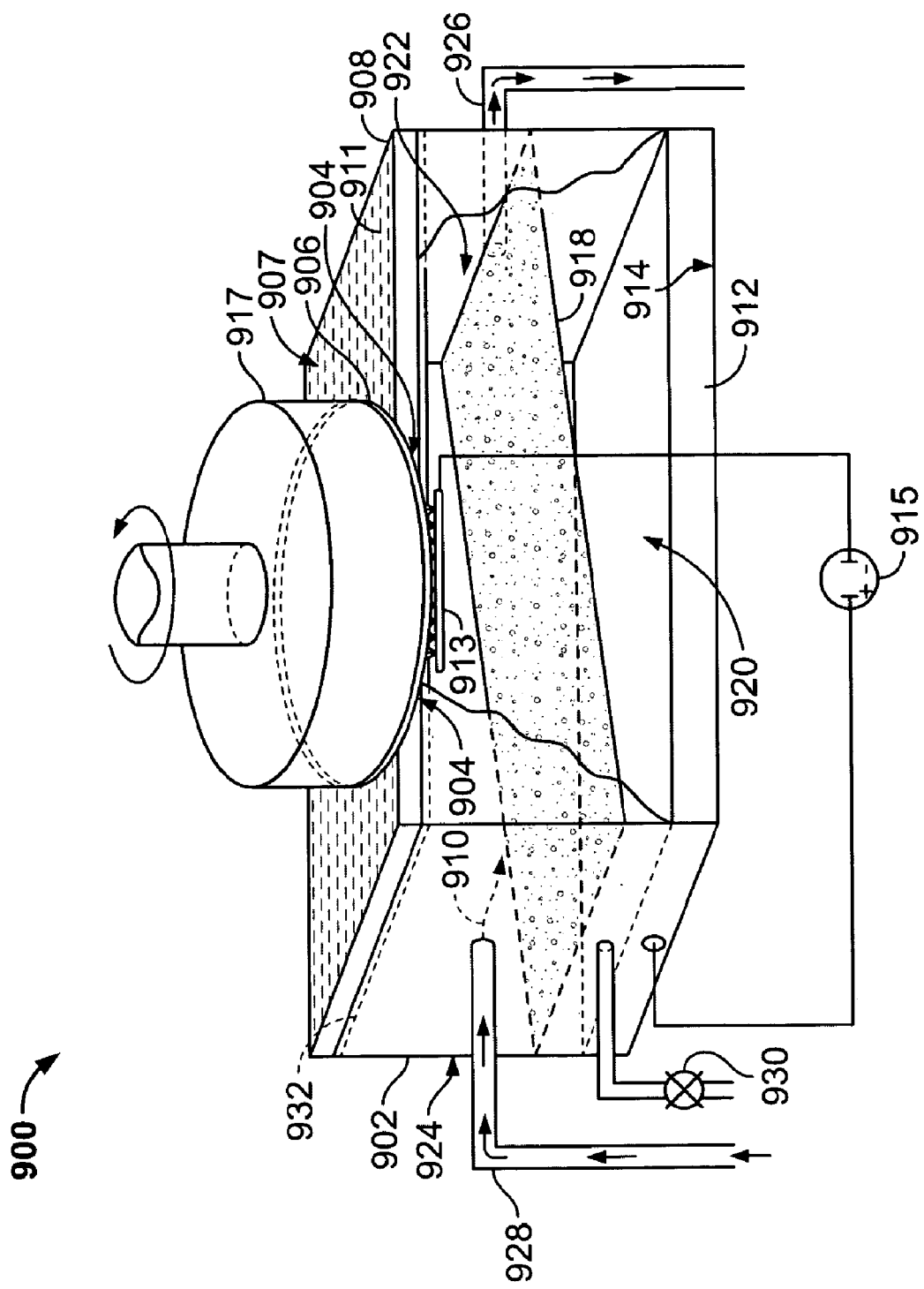
FIG. 11 shows an exemplary Electrochemical Mechanical Processing (ECMPR) system using reverse solution flow in an anode housing in accordance with an embodiment of the present invention.

FIG. 11 illustrates, in perspective view, an exemplary Electrochemical Mechanical Processing (ECMPR) system 900 using the reverse solution flow of the present invention in anode housing 902. In this embodiment, the housing may have a rectangular shape having one lateral dimension which is shorter than the other lateral dimension. For example, FIG. 12 shows a side view along the longer lateral dimension of the housing 902. One such rectangular anode housing design is exemplified in U.S. application Ser. No. 09/760,757, now U.S. Pat. No. 6,610,190, entitled, Method and Apparatus For Electrodeposition of Uniform Film on Substrate, filed Jan. 17, 2001 and commonly owned by the assignee of the present invention. Referring to FIGS. 11 and 12, surface 904 of a wafer 906 is placed in proximity of top surface 907 of a workpiece surface influencing device 908 of the system 900. The workpiece surface influencing device (WSID) 908 has a rectangular shape and encloses the top opening 909 of the housing. This rectangular design of the WSID and the housing allow electrical contacts 913 to touch the edge of the wafer. During the plating process, a potential difference between the anode and the electrical contacts is established using a power supply 915. A plating solution 910 fills the housing 902 and flows through channels 911 while contacting both the surface of the wafer and an anode 912 which is placed on bottom wall 914 of the housing 902. The anode 912 is kept submerged in the plating solution that fills the anode housing. The anode 912 has a rectangular shape corresponding to the shape of the WSID 908 to establish deposition uniformity over the entire surface of the WSID. During the process wafer is held and moved, i.e., rotated and laterally moved by a workpiece carder head 917.

A filter 918 divides the housing 902 into an anode chamber 920 and a supply chamber 922. In the anode chamber, at least one bleeding port 926 is placed adjacent an upper end of the filter 918 for removing gas bubbles. The plating solution 910 is supplied to the supply chamber 922 through a supply port 928 of the sidewall 924 of the housing 902. Flow of plating solution 910 to the anode chamber 920 takes place through the filter 918. As in the system 500 above, the solution flows to anode chamber 920 and leaves the anode chamber 920 through the bleed port 926. At the beginning of the plating process, an auxiliary inlet valve 930 may be used to supply plating solution 910 into the anode chamber 920. The auxiliary inlet valve may be positioned in the sidewall 914 of the housing 902. Optionally, an upper filter 932 is placed adjacent the opening 908 and under the WSID 908 to filter the solution flowed through the supply chamber 922 against the surface of the surface of the wafer. Solution that is flowing through the WSID 908 and the bleed port 926 is collected by the recycling circuitry (not shown) to replenish and feed back to the housing 902.

It should be noted that when ECMD process is carried out using the system of FIGS. 11 and 12, the wafer surface is brought down onto the surface 907 of the WSID 908. This causes a pressure increase in the supply chamber 922 and the flow of solution into the anode chamber 920, via the filter 918, increases. During idle flow, the wafer is not placed on the WSID 908 and pressure in the supply chamber 922 is low and, as a result, solution flow into the anode chamber 920 is also low. This self-regulation advantageously reduces additive consumption during idle flow and causes the solution flow over the anode to increase during the process when such solution flow is possible.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. A system for electroplating a surface of a workpiece using a process solution, comprising:
    a solution housing configured to house an electrode and to contain the process solution;
    a first filter element disposed in the solution housing configured to partition the solution housing into a lower chamber and an intermediate chamber;
    a second filter element disposed between the intermediate chamber and an upper chamber; and
    an upper inlet port coupled to the solution housing configured to deliver the process solution to the upper chamber of the solution housing to fill the upper chamber and the lower chamber immersing the electrode in the lower chamber.

2. The system of claim 1 further comprising a discharge port coupled to the lower chamber configured to discharge process solution from the lower chamber of the solution housing.

3. The system of claim 1 further comprising a lower inlet port coupled to the lower chamber configured to deliver process solution to fill the lower chamber of the solution housing with the process solution.

4. The system of claim 1, wherein the first filter element includes a first section having a first pore size and a second section having a second pore size.

5. The system of claim 1, wherein the first filter element includes pores with graded size.

6. The system of claim 1, wherein the second filter element includes a pore size smaller than the first filter element.

7. The system of claim 1, wherein the upper inlet port is in a wall of the upper chamber and is configured to deliver the process solution to fill the intermediate chamber.

8. The system of claim 1, further comprising an intermediate inlet port in a wall of the intermediate chamber, the intermediate inlet port being configured to deliver process solution to fill the intermediate chamber with the process solution.

9. The system of claim 8, wherein the intermediate inlet port is configured to deliver process solution to fill the upper chamber.

10. The system of claim 1, wherein the first or the second filter element is configured to guide bubbles to an outlet port.

* * * * *